United States Patent [19]

Seki et al.

[11] 4,367,504
[45] Jan. 4, 1983

[54] PIEZO-ELECTRIC BIMORPH TYPE TRANSDUCER

[75] Inventors: Takeo Seki, Kokubunji; Yukio Shinoda, Kodaira; Akio Kumada, Kokubunji, all of Japan

[73] Assignees: Hitachi Denshi Kabushiki Kaisha, Tokyo; Hitachi, Ltd., both of Japan

[21] Appl. No.: 250,432

[22] Filed: Apr. 2, 1981

[30] Foreign Application Priority Data

Apr. 12, 1980 [JP] Japan .................. 55-47504

[51] Int. Cl.$^3$ ................ G11B 21/10; G11B 21/18
[52] U.S. Cl. ................................... 360/109
[58] Field of Search .............. 360/109, 77, 70, 107; 310/311, 320, 330–332

[56] References Cited

U.S. PATENT DOCUMENTS

| 4,093,885 | 6/1978 | Brown | 310/331 |
| 4,099,211 | 7/1978 | Hathaway | 360/109 |
| 4,106,065 | 8/1978 | Ravizza | 360/109 |
| 4,151,570 | 4/1979 | Ravizza et al. | 360/109 |
| 4,165,523 | 8/1979 | Hathaway | 360/77 |
| 4,326,228 | 4/1982 | Sakamoto | 360/109 |

Primary Examiner—Alfred H. Eddleman
Attorney, Agent, or Firm—Oblon, Fisher, Spivak, McClelland & Maier

[57] ABSTRACT

A piezo-electric bimorph type transducer of a cantilever type for controlling the scan tracking of a magnetic tape by a rotating head in a helical-scan-type video tape recorder. In this transducer, piezo-electric thin plates which constitute a piezo-electric bimorph are formed in a different shape from the electrodes attached to the piezo-electric thin plates, and the width of the electrodes is smaller than the width of the piezo-electric thin plates in the direction from a fixed end of the transducer toward a movable end of the same, whereby in the bimorph element, a predetermined relationship is attained between the bending moment produced by a control voltage applied to the electrodes and the innertia generated in a dynamic condition, and the displacement of the magnetic head caused by the piezo-electric bimorph type transducer is in static and dynamic conformity, so that the tracking control is correctly carried out.

5 Claims, 14 Drawing Figures

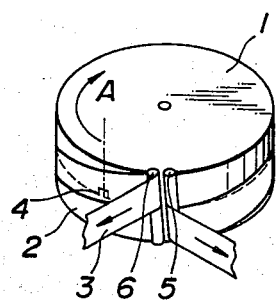
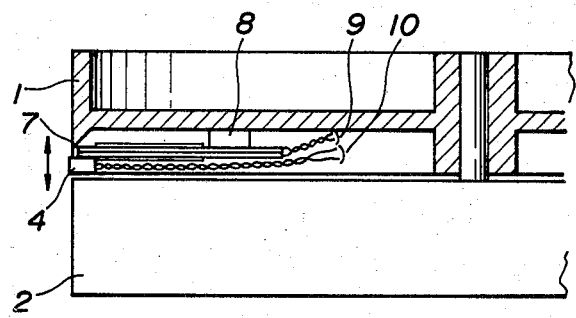

PIEZO-ELECTRIC BIMORPH TYPE TRANSDUCER

BACKGROUND OF THE INVENTION

The present invention relates to a piezo-electric bimorph type transducer for shifting a magnetic head in order to provide tracking correction, which is suitable for use with magnetic recording and reproduction apparatus, in particular, for use with a rotary head helical-scan-type video tape recorder.

As an apparatus for recording and reproducing signals having a broad frequency band, rotary-head-type magnetic record and reproduction apparatus, the so-called video tape recorder (hereinafter referred to as the VTR), is known.

In the VTR, a magnetic head, which works as a converter for recording and reproduction, is disposed around a rotary disc or a rotating drum, constituting a rotating head.

The thus constructed rotating head is rotated, so that signals are recorded in discontinuous signal-recording tracks formed on a magnetic tape, which tracks are inclined at a predetermined angle with respect to the running direction of the magnetic tape. The signals recorded are also reproduced from the tracks. The VTR is designed so as to be capable of recording and reproducing signals having a broad frequency band, such as television signals, without increasing the moving speed of the magnetic tape significantly. Conventionally, a VTR of that type in which the signal-recording tracks are formed at a comparatively great angle (for example, nearly at a right angle), with respect to the moving direction of the magnetic tape, has been most widely used.

From the view point of simplicity in handling the magnetic tape, it is preferable that the magnetic tape not be very wide. Therefore, in the above-mentioned conventional type VTR, the length of the discontinuous signal-recording tracks is limited, so that it is extremely difficult to record television signals for one field continuously in each single signal-recording track. Therefore, usually signals for one field are separately recorded in a plurality of signal-recording tracks by the so-called segment-type recording method. Furthermore, the magnetic tape has to be brought into close contact with the rotating head, with the magnetic tape being curved in the shape of an arc in the direction of the width of the tape. However, when the winding angle of the magnetic tape around the rotating head increases beyond a certain angle, it becomes difficult to move the magnitic tape accurately and stably and to load the magnetic tape on to the rotating head properly. In order to overcome those difficulties, conventionally a plurality of rotating heads (for example, four rotating heads) are disposed and successively employed for continuous recording or for continuous reproduction.

Therefore, in this type VTR, switching of the rotating heads during recording or reproducing the signals for one field is unavoidable. Such switching of the rotating heads is apt to bring about the so-called banding, causing significant deterioration of the image quality if recording and reproduction are repeated. Furthermore, in the VTR, it is extremely difficult to perform tricky reproductions including slow motion, still, reverse and quick access by changing the the running conditions of the magnetic tape. Therefore, an additional memory device has to be employed for the above-mentioned purposes. Furthermore, the recorded image cannot be monitored during quick access and reverse access.

In order to improve on the above-mentioned shortcomings of the conventional VTR, in which signal-recording tracks are formed at a comparatively small angle (for example, 2 to 4 degrees) with respect to the running direction of the magnetic tape. The VTR of this type has given solutions to most of the problems of the conventional VTR.

In the helical-scan-type VTR, a magnetic head is mounted on a rotating drum having a comparatively large diameter (for instance, a drum having a diameter of about 135 mm). Scanning is done with a magnetic tape slantingly wound around the peripheral surface of the rotating drum. In the VTR, the winding path of the magnetic tape around the rotating drum can be as large as about 360 degrees around the drum. Therefore, it is possible to perform recording and reproduction substantially continuously by use of one magnetic head. Further, each continuous signal-recording track is comparatively long, for example, as long as about 420 mm. Therefore, television signals for one field can be stored in each continuous, single signal-recording track, so that a non-segment type VTR can be constructed by the above-mentioned system. The non-segment type VTR is advantageous on the following points: It is free from the so-called banding. The tricky reproductions can be done without any difficulty. The recorded images can be monitored during quick access and reverse access. Therefore, the VTR of this type will be most widely used in the near future.

As mentioned above, when signals are recorded in the helical-scan-type VTR (hereinafter referred to as the H-VTR), 400 mm or longer signal-recording tracks are formed side by side in the magnetic tape at an inclination of 2 to 4 degrees with respect to the running direction of the magnetic tape. When reproducing the recorded signals, the signal-recording tracks have to be traced accurately. Therefore, extremely high mechanical accuracy is required for the scanning system, including the rotating drum, a magnetic tape driving system and an operation control system. Such mechanical accuracy has to be maintained under any changes in ambient conditions, including temperature and humidity. Therefore, in order to produce practically useful H-VTR's, various sophisticated techniques are required.

Even if the magnetic tape can be driven with sufficiently high accuracy and the magnetic tape can be scanned perfectly by a rotating head by use of high mechanical techniques, it will still be extremely difficult to locate the signal-recording track patterns formed on the magnetic tape with accuracy comparable to the accuracy attained in the mechanical parts of the VTR, including the magnetic tape driving and scanning means.

More specifically, due to the characteristics of the materials which form a tape base of the magnetic tape, it is almost impossible to eliminate any and all changes in size of the magnetic tape, since the size will be changed, for instance, in accordance with change in the ambient temperature or humidity, and changes in tension applied to the magnetic tape or deterioration of the tape with time.

Therefore, it will be extremely difficult to perform the proper tracking of the magnetic tape by a magnetic head for reproducing signals recorded in the magnetic tape, if a long period of time has passed after the recording or if the recording was done under conditions different from those of the reproduction.

Furthermore, it will be impossible to produce a plurality of H-VTR's exactly of the same accuracy and to maintain them at the same accuracy over a long period of time while in use, even if the best techniques are employed. Moreover, it could happen that one magnetic tape is used on a plurality of H-VTR's which are slightly different in mechanical accuracy. In this case, it will be difficult to perform the proper tracking of the magnetic tape in each H-VTR by the magnetic head.

In order to improve on the above-mentioned shortcomings, methods of employing an automatic tracking apparatus for the H-VTR have been proposed in U.S. Pat. Nos. 4,093,885, 4,106,065, 4,151,570 and 4,165,523.

These automatic tracking apparatuses cause a rotating head to trace the signal-recording tracks consistently accurately by automatically correcting its tracking during reproduction of recorded signals.

An automatic tracking apparatus of the above-mentioned type comprises a detection and control means for detecting whether or not the magnetic head is accurately tracing the proper signal-recording track and for producing control signals in accordance with that detection, and a shifting means for shifting the magnetic head, in accordance with the control signals, in the direction normal to the length of the recording tracks.

Referring to FIG. 1 to FIG. 3, an example of such a magnetic head shifting apparatus for use in such an H-VTR will not be explained.

In FIG. 1, reference numeral 1 designates a rotating drum; reference numeral 2, a guide drum; reference numeral 3, a magnetic tape (hereinafter referred to as the tape); reference numeral 4, a magnetic head; reference numeral 5, a guide post on the tape-inlet side; and reference numeral 6, a guide post on the tape-outlet side. Symbol A represents an original point where the magnetic head 4 starts to scan the tape 3.

The tape 3 is wound around the guide drum 2 and the rotating drum 1 so as to cover the two drums 1 and 2 in a spiral manner, with an inner magnetic layer of the tape 3 being in contact with the outer peripheral surfaces of the drums 1 and 2, as shown in FIG. 1. The tape 3 is maintained at a predetermined position by the two guide posts 5 and 6 so as to be capable of performing the predetermined running.

The magnetic head 4 is attached to a lower surface of the rotating drum 1 and is projected slightly from between the rotating drum 1 and the guide drum 2 to the outer peripheral surfaces of the two drums 1 and 2.

When the rotating drum 1 is rotated in the direction of the arrow, the magnetic head 4 scans the magnetic layer of the tape 3 along a predetermined track pattern. In normal operation, the tape 3 is also running in the direction of the arrow, whereby the track patterns, which are formed side by side, are successively scanned.

The magnetic head 4 is maintained by a transducer at such a position as to be capable of deviating in the direction substantially parallel to the rotating shaft of the rotating drum 1. By controlling the deviation, automatic tracking is carried out. That mechanism is shown in FIG. 2.

FIG. 2 is a sectional side view of part of the rotating drum 1 shown in FIG. 1. In FIG. 2, reference numeral 7 represents a piezo-electric bimorph element which constitutes the transducer; reference numeral 8, an attachment member; reference numeral 9, lead wires from the piezo-electric bimorph element 7; and reference numeral 10, signal lead wires from the magnetic head 4. The details of the bimorph element 7 are shown in FIG. 3. In the figure, reference numerals 7a and 7b are rectangular piezo-electric thin plates, made of ceramic plates with piezo-electric characteristics, for instance, plates made of barium titanate; and reference numeral 7c, 7d and 7e, electrode plates made of a conductive film.

When a voltage is applied to the lead wires 9, one of the piezo-electric thin plates 7a and 7b extends and the other shrinks, so that the bimorph element 7 is bent. The bending direction and the bending distance of the bimorph element 7 can be controlled as desired by the voltage applied to the lead wires 9 and by the polarity of the applied voltage. The bimorph element 7 constitutes a cantilever with a fixed end supported by the attachment member 8 and with a movable end to which the magnetic head 4 is attached. Thus, the magnetic head 4 can be moved in the directions of the arrow as shown in FIG. 2 and FIG. 3 in accordance with the polarity and magnitude of voltage applied to the lead wires 9, whereby the magnetic head 4 can be shifted to the desired position, so that the tracking of the track patterns formed on the tape 3 can be changed as desired.

When the magnetic head 4 deviates from the track pattern, that deviation is detected by some means to produce a control signal indicating the deviation, and the control signal is applied to the lead wires 9, so that the deviation of the tracking is corrected.

As can be seen from the above, in the magnetic head shifting apparatus for tracking correction for use in the H-VTR, a cantilever type transducer comprising a piezo-electric bimorph element is generally used, taking into consideration centrifugal acceleration generated during recording and reproduction operations and the effect of the centrifugal acceleration on the magnetic head. One of the requirements for such a transducer to be employed for the above-mentioned purpose is that it be excellent in transient response.

In such a transducer, some time lag due to displacement of the magnetic head and the bimorph is unavoidable. However, it is preferable that adverse vibrations of the magnetic head and the bimorph, generated by the displacement thereof, become zero within a certain period of time.

In order to reduce the adverse vibrations generated by the displacement of the magnetic head and the bimorph, generally a signal for attenuating such vibrations (hereinafter referred to as the attenuation signal), produced by an electric circuit, is caused to overlap with a control signal, as in the method proposed in U.S. Pat. No. 4,080,636. However, in a conventional bimorph, its bending effected by the control signal is not in static and dynamic conformity which will be described in detail later. Therefore, when the vibrations of a certain portion of the bimorph, for example, of a portion near the attachment portion of the magnetic head, are nulified by the attenuation signal, the vibrations of other portions of the bimorph do not become zero at the same time.

Furthermore, the rigidity of the piezo-electric bimorph which constitutes a transducer is limited and, as a matter of fact, the rigidity cannot be increased beyond a certain limit, in order to maintain practical sensitivity. Moreover, the bimorph and the magnetic head respectively have their particular weight. Therefore, in a cantilever type transducer of the above-mentioned type, the level of the control signal and the displacement of the magnetic head do not correspond accurately when the speed of the change in the level of the control signal applied to the transducer, that is, the frequency of the control signal, increases beyond a certain value. Therefore, the conventional piezo-electric bimorph type transducer has the shortcoming that the accurate correction of tracking is extremely difficult.

The above-mentioned phenomenon will now be explained in more detail. When a control signal is applied to the bimorph element, the bimorph element is bent in accordance with the voltage level of the control signal, changing the position of the movable end. However, as mentioned above, the bimorph element and the magnetic head have each their specific mass and inertia. Therefore, when the frequency of the control signal increases beyond a certain frequency, the movable end of the cantilever type bimorph element is moved with complicated mortion, which is difficult from the waveform of the control signal applied to the bimorph element.

In other words, when the change in the voltage of the control signal with time are made moderately, substantially eliminating the effect of the above-mentioned inertia (which state is referred to as the static displacement), the bent state of the entire bimorph element does not conform to the bent state of the entire bimorph element when the changes in voltage are made speedy and the above-mentioned inertia becomes conspicuous (which state is referred to as the dynamic displacement).

Hereinafter, the state of this nonconformity is referred to as the static and dynamic nonconformity state, while the state in which the static displacement and the dynamic displacement are in conformity with each other is referred to as static and dynamic conformity.

Referring to FIG. 4 and FIG. 5, there are shown the bent states of the cantilever type bimorph element. FIG. 4 shows the static and dynamic conformity state, while FIG. 5 shows the static and dynamic nonconformity state. In each of the figures, the broken lines indicate the bending of the bimorph element.

As can be seen from FIG. 5, in the static and dynamic nonconformity state, the displacement of the movable end of the bimorph element does not necessarily indicate its bent state. Therefore, the magnetic head cannot be moved in exact synchronization with the waveform of the control signal. As a result, correction of the tracking becomes difficult.

Moreover, in the static and dynamic nonconformity state, excess bending of the bimorph element takes place at its movable end, and the magnetic head is directed in a direction other than the predetermined direction. As a result, the contact end of the magnetic head does not come into close contact with the magnetic tape in the operation gap, degrading the recording and reproduction characteristics, causing abnormal vibrations in the magnetic head, and damaging the bimorph element.

SUMMARY OF THE INVENTION

It is therefore an object of the present invention to provide a piezo-electric bimorph type transducer in which the bimorph element is always bent in the static and dynamic conformity state and, when a magnetic head is fixed with a bimorph element bent in a certain bent state, the entire bimorph element is fixed at the same time, avoiding the shortening of the life of the bimorph element caused by vibrations remaining in the bimorph element, and avoiding adverse changes in the reproduction video signals which are caused by the angular vibrations of the magnetic head.

In order to attain this object, electrodes which constitute the bimorph element, are designed in such a manner that the width of the electrode decreases gradually from the fixed end of a cantilever towards the movable end thereof, and the width of the electrodes, except the fixed end thereof, is smaller than the width of a piezo-electric material which constitutes the bimorph element.

According to the present invention, a piezo-electric bimorph type transducer for shifting a magnetic head accurately in order to correct the tracking, for instance, in the H-VTR, from which transducer the shortcomings of the conventional technique in this field have been eliminated, is provided by a simple construction in which the electrodes of a piezo-electric bimorph element, constituting a transducer for attaining the shifting of the magnetic head with static and dynamic conformity, are formed in a predetermined shape which is different from that of a piezo-electric thin plate.

BRIEF DESCRIPTION OF THE DRAWINGS

In the drawings,

FIG. 1 is a perspective view of a magnetic tape wound around a rotary head drum in a video tape recorder of the helical-scan-type.

FIG. 2 is a sectional side view of the rotary head drum in FIG. 1.

DETAILED DESCRIPTION OF THE PREFERRED EMBODIMENTS

Figure 6:
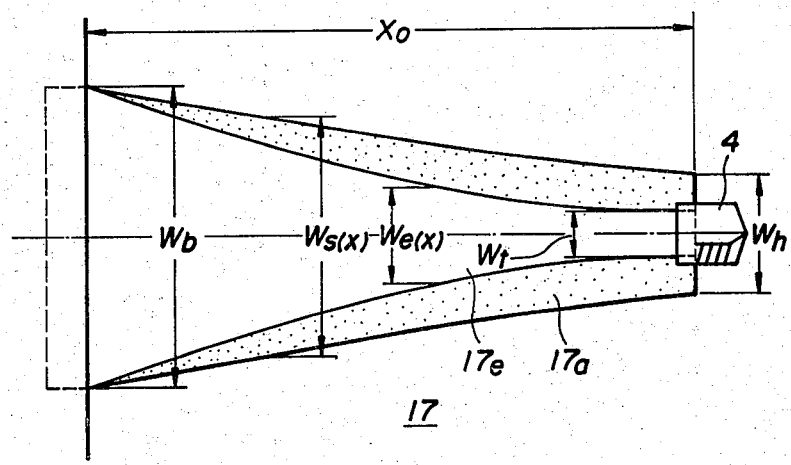
FIG. 6 is a plan view of an embodiment of a piezo-electric bimorph type transducer according to the present invention.
Figure 7:
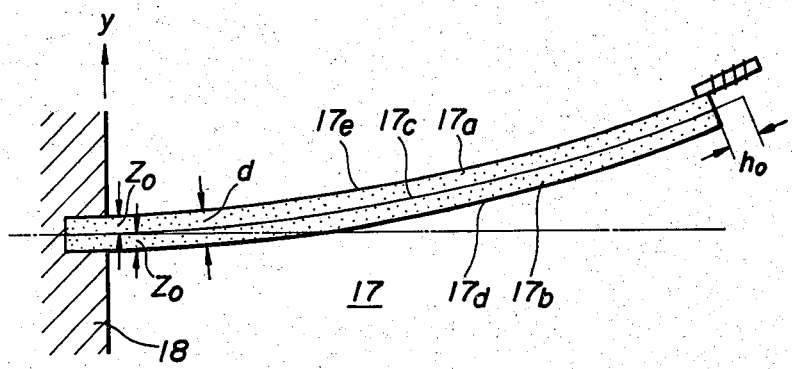
FIG. 7 is a side view of the piezo-electric bimorph type transducer in FIG. 6.

Referring to FIG. 6 and FIG. 7, an embodiment of a piezo-electric bimorph type transducer according to the present invention will now be explained. FIG. 6 is a plan view of the piezo-electric bimorph type transducer and FIG. 7 is a side view of the same.

In these figures, reference numeral 17 designates a piezo-electric bimorph element; reference numerals 17a and 17b, piezo-electric thin plates comprising barium titanate ceramics; reference numerals 17c, 17d and 17e, electrodes; and reference numeral 18, a support member. The magnetic head 4 is the same as that shown in FIG. 1 through FIG. 3. Other components necessary for the transducer for shifting the magnetic head 4, which are not shown in the figures, are the same as those shown in FIG. 1 through FIG. 3.

Figure 3:
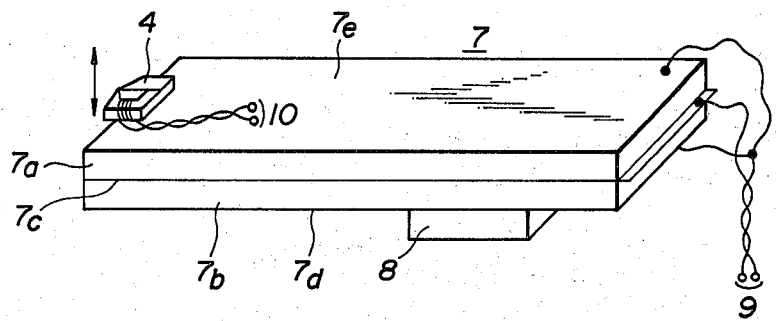
FIG. 3 is a perspective view of a bimorph element.

The differences between the embodiment of a piezo-electric bimorph type transducer according to the present invention shown in FIG. 6 and FIG. 7 and the conventional bimorph element as shown in FIG. 1, FIG. 2 and FIG. 3 are as follows: In the present invention, the shapes of the electrodes 17c, 17d and 17e are not the same as those of the piezo-electric thin plates 17a and 17b, and, when the width of the piezo-electric thin plates 17a and 17b at the fixed end thereof supported by the support member is Wb, and the width of the same at the movable end to which the magnetic head 4 is attached is Wh, and the width of the same at an arbitrary point between the movable end and the fixed end is Ws, the width of the electrodes 17c, 17d and 17e at the fixed end is equal to Wb. However, the width of the electrodes 17c, 17d and 17e at the movable end is Wt, which is narrower than the width Wh. Moreover, the width of the electrodes 17c, 17d and 17e gradually decreases towards the movable end from the fixed end. The width of the electrodes 17c, 17d and 17e at the arbitrary point, We, is a function of the length from the fixed end towards the movable end, G(x). The width of the electrodes 17c, 17d and 17e is narrower than the width Ws of the piezo-electric thin plates 17a and 17b at any point except the width Wb at the fixed end.

Further, in the above-mentioned embodiment, the piezo-electric thin plates 17a and 17b are not rectangular in shape. That is not necessarily an essential requirement for the present invention, but is a difference between the present embodiment and the conventional piezo-electric bimorph element.

The operation of the embodiment of a piezo-electric bimorph type transducer according to the present invention will now be explained.

Figure 4:
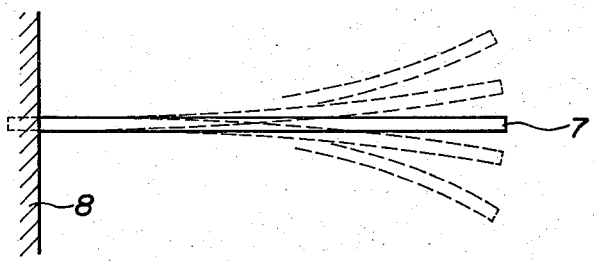
FIG. 4 and FIG. 5 are side views of the bent states of the bimorph element.
Figure 5:
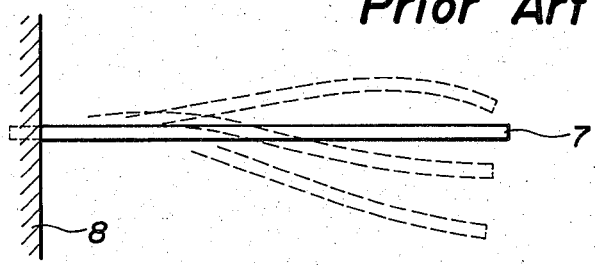

As can be seen from the previous explanation about FIG. 3, when a control signal is applied to the electrodes 17c, 17d and 17e, one of the piezo-electric thin plates 17a and 17b extends and the other shrinks, so that the bimorph element 17 is bent, causing displacement of the magnetic head 4 attached to the movable end of the bimorph element 17. At that moment, the bimorph element 17 is bent with static and dynamic conformity as shown in FIG. 4. Such bending as shown in FIG. 5 does not take place, in which the bending is in static and dynamic nonconformity.

The reasons for this are as follows:

Referring to FIG. 7, let the direction of the length of the bimorph element 17 be the x-axis, and the direction normal to the x-axis and the width of the bimorph element 17 by the y-axis, and the origin of the coordinates be positioned at the fixed end. The displacement of the bimorph element 17 at an arbitrary point x on the x-axis in the direction of the y-axis is described as follows as a function of the point x and the time t.

$$y = F(x, t) \tag{1}$$

The condition for attaining the static and dyanmic conformity is provided by y which is the product of a function of only x which holds for all values of x, and a function of only t. Hence, the condition for attaining static and dynamic conformity is provided by the following equation:

$$y(x, t) = \psi(x) \cdot y_0(t) \tag{2}$$

When this condition is satisfied, the relationship between x and y at a certain time t is represented only by a function $\psi(x)$. This relationship is independent of the time t.

Therefore, the relationship between x and y is shown by the broken lines in FIG. 4, and the situation as shown by the broken lines in FIG. 5 does not take place.

In the present invention, an equation of motion is set up concerning the bimorph element 17 in which the width of the piezo-electric thin plates 17a and 17b and the width of the electrodes 17c, 17d and 17e each change in the direction of the x-axis as shown in FIG. 6 and FIG. 7. The condition for static and dynamic conformity defined by Equation (2) is introduced into that equation of motion in order to obtain the above-mentioned changes in the width of the piezo-electric thin plates 17a and 17b and the width of the elctrodes 17c, 17d and 17e, whereby the bimorph element 17 which satisfies the static and dynamic conformity condition is obtained.

For the above-mentioned purpose, an equation of motion concerning a cantilever type transducer employing the bimorph element 17 is set up.

The basis of the equation of motion to be obtained is the equilibrium relationship between the bending moments in each portion of the bimorph element 17.

Figure 8:
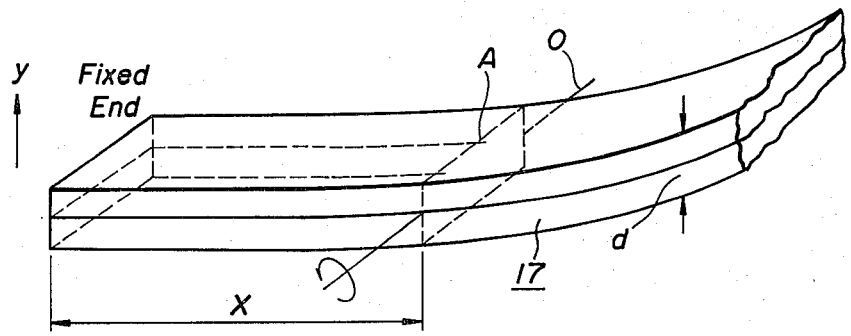
FIG. 8, FIG. 9 and FIG. 10 are diagrams in explanation of the bending moment of the bimorph element.

Referring to FIG. 8, an axis o which is in the contact plane between the two piezo-electric thin plates 17a and 17b and is normal to the x-axis is supposed at the position at a distance x from the fixed end of the bimorph element 17. In this case, it can be considered that the following three bending moments exist around the axis o:

BMp(x, t): Bending moment generated by the piezo-electric effect of the bimorph element BMe(x, t): Bending moment generated by the elasticity of the bimorph element BMi(x, t): Bending moment generated by the inertia of the mass of the bimorph element and the inertia of the mass of the magnetic head The above-mentioned three bending moments are each a function of the distance x from the fixed end along the x-axis (with its origin at the fixed end) and the time t. Since these three bending moments are in equilibrium, the following equation of motion can be obtained:

$$BMp(x, t) + BMe(x, t) + BMi(x, t) = 0 \tag{3}$$

The above-mentioned three bending moments are each now obtained.

Figure 9:
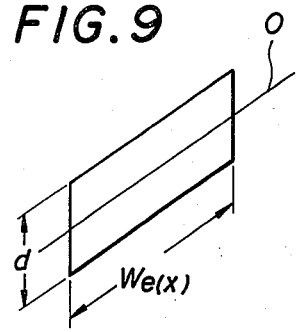

The bending moment BMp(x, t) generated by the piezo-electric effect can be obtained by integrating the bending moment generated by the piezo-electric effect and acting upon a rectangular area A as shown in FIG. 8, which area A is d wide by We(x) long (as shown in FIG. 9) in the cross section including the axis o, which cross section is normal to the parallel upper and lower surfaces of the bimorph element 17 in FIG. 8.

$$BMp(x, t) = -\int_{-\frac{d}{2}}^{0} \frac{V(t)}{d} \alpha We(x) z \, dz \tag{4}$$

$$+ \int_{0}^{\frac{d}{2}} \frac{V(t)}{d} \alpha We(x) z \, dz$$

$$= We(x) \cdot \frac{d}{4} \cdot \alpha \cdot V(t)$$

where z is the coordinate in the direction of the thickness of the bimorph element, with the origin on the axis o; V(t) is the voltage applied between the upper electrode and lower electrode of the bimorph element; d is the thickness of the bimorph element; and $\alpha$ is the piezo-electric coefficient of the bimorph element.

The bending moment BMe(x, t) generated by the elasticity of the bimorph element will now be obtained.

Figure 10:
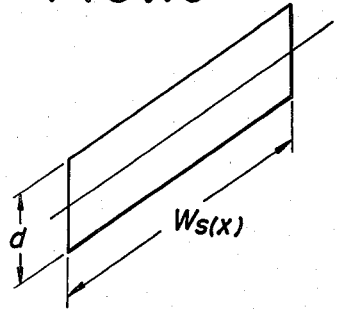

As in the case of the bending moment BMp(x, t), the cross section A which includes the axis o in FIG. 8 and is normal to the upper and lower surfaces of the bimorph element is supposed. The bending moment around the axis o, which acts upon a rectangular area Ws(x) wide by d long, which are respectively equal to the width and thickness of the bimorph element in the integration area as shown in FIG. 10, is integrated.

$$BMe(x, t) = \int_{-\frac{d}{2}}^{\frac{d}{2}} \frac{\delta^2 y(x, t)}{\delta x^2} \epsilon Ws(x) z^2 dz \quad (5)$$

$$= -Ws(x) \cdot \epsilon \cdot \frac{d^3}{12} \cdot \frac{\delta^2 y(x, t)}{\delta x^2}$$

where y(x, t) is a function representing the bending of the bimorph element in the direction of the y-axis, which function is the same as Equation (2), and $\epsilon$ is the modulus of elasticity of the bimorph element.

Finally, the bending moment BMi(x, t) generated by the inertia is obtained. The inertia contains two types of inertia, one of which is caused by the mass of the magnetic head and the other of which is caused by the mass of the bimorph element.

When the center of gravity of the magnetic head is at the tip of the bimorph element, that is, at the point of $x = x_0$, the bending moment generated at the point x is $$-\frac{\delta^2 y(x_0, t)}{\delta t^2} m_h(x_0 - x)$$

where $m_h$ is the mass of the magnetic head and $x_o$ is the length of the bimorph element.

The bending moment at the point x caused by the mass of the bimorph element is obtained by the following integration:

$$-d \cdot \Delta m \int_{\xi = x}^{x_0} Ws(\xi) \frac{\delta^2 y(\xi, x)}{\delta t^2} (\xi - x) d\xi$$

where $\Delta m$ is the mass density of the bimorph element. Hence, the bending moment BMi(x, t) produced by the inertia is obtained as follows:

$$BMi(x, t) = -\frac{\delta^2 y(x_0, t)}{\delta t^2} m_h(x_0 - x) \quad (6)$$

$$-d \cdot \Delta m \int_{\xi = x}^{x_0} Ws(\xi) \frac{\delta^2 y(\xi, x)}{\delta t^2} (\xi - x) d\xi$$

Thus, three types of bending moments, BMp(x, t), BMe(x, t) and BMi(x, t), are respectively obtained by Equation (4), Equation (5) and Equation (6). By substituting these equations into Equation (3), the basic equation of motion concerning the bimorph element can be obtained as follows:

$$We(x) \frac{d}{4} \alpha V(t) - Ws(x) \epsilon \frac{d^3}{12} \frac{\delta^2 y(x, t)}{\delta x^2} - \quad (7)$$

-continued $$\frac{\delta^2 y(x_0, t)}{\delta t^2} - m_h(x_0 - x) -$$

$$d\Delta m \int_{\xi = x}^{x_0} Ws(\xi) \frac{\delta^2 y(\xi, t)}{\delta t^2} (\xi - x) d\xi = 0$$

The function y(x, t) indicating the bending of the bimorph element will now be explained.

As mentioned previously, this function has to be the product of a function indicating the space coordinate x and a function indicating the time, which are independent of each other, in order that the bimorph element be in static and dynamic conformity.

For the convenience of calculation, $\psi(x_0)$ is normalized in Equation (2) as follows:

$$\psi(x_0) = 1 \quad (8)$$

Since the bimorph element is fixed at the fixed end thereof, $$\psi(0) = 0 \quad (9)$$

$$\left. \frac{d\psi(x)}{dx} \right|_{x=0} = 0 \quad (10)$$

are obtained.

By substituting Equation (2) and Equation (8) into Equation (7), the following equation is obtained:

$$We(x) \frac{d}{4} \alpha V(t) - Ws(x) \epsilon \frac{d^3}{12} \frac{d^2 \psi(x)}{dx^2} y_0(t) \quad (11)$$

$$- \frac{d^2 y_0(t)}{dt^2} m_h(x_0 - x)$$

$$- d\Delta m \frac{d^2 y_0(t)}{dt^2} \int_{\xi = x}^{x_0} Ws(\xi) \psi(\xi)(\xi - x) d\xi = 0$$

Since Equation (11) holds at any time t, time $t_1$ or time $t_2$, which respectively satisfies the following equations, is selected:

$$y_0(t_1) = 0 \quad (12)$$

$$\left. \frac{d^2 y_0(t)}{dt^2} \right|_{t=t_2} = 0 \quad (13)$$

At each of the times selected above, the following identical equations are obtained, which are the function of only x and are independent of the time:

$$\begin{cases} We(x) = S_1 \left[ m_h(x_0 - x) + d\Delta m \int_{\xi = x}^{x_0} Ws(\xi)\psi(\xi)(\xi - x) d\xi \right] & (14) \\ We(x) = S_2 Ws(x) \frac{d^2 \psi(x)}{dx^2} & (15) \end{cases}$$

$$S_1 = -4 \frac{C_2}{C_1} \frac{1}{\alpha d} \quad (16)$$

$$S_2 = \frac{1}{3} \frac{C_4}{C_3} \epsilon d^2 \frac{1}{\alpha} \quad (17)$$

-continued $$C_1 = |V(t)|_{y_0(t)=0}$$

$$C_2 = \left|\frac{d^2y_0(t)}{dt^2}\right|_{y_0(t)=0}$$

$$C_3 = |V(t)| \left.\frac{d^2y_0(t)}{dt^2}\right. = 0$$

$$C_4 = |y_0(t)| \left.\frac{d^2y_0(t)}{dt^2}\right. = 0$$

From Equation (14) and Equation (15), the relationship between We(x) and Ws(x), which satisfies the condition of static and dynamic conformity of the bimorph element, can be obtained.

With respect to the bimorph element 17 in the embodiment of a piezo-electric bimorph type transducer according to the present invention, which is shown in FIG. 6 and FIG. 7, the width We of the electrodes 17c, 17d and 17e is determined by the function G(x) which is described by Equation (14) and Equation (15). When Equation (14) and Equation (15) are satisfied, the condition of static and dynamic conformity is satisfied. Therefore, the bimorph element 17 as shown in FIG. 6 and FIG. 7 is bent in accordance with the control signal, maintaining static and dynamic conformity, whereby the magnetic head 4 is correctly moved.

The above-mentioned embodiment according to the present invention is of the universal type, which is always capable of attaining static and dynamic conformity operation in an extremely braod operational range of conditions. However, for practical use, such universality is rarely required.

Therefore, another embodiment of a piezo-electric bimorph type transducer according to the present invention, for use under certain more limited conditions, will now be explained, which is more suitable for practical use than the first mentioned embodiment and which can attain the advantages of the present invention sufficiently.

Figure 11:
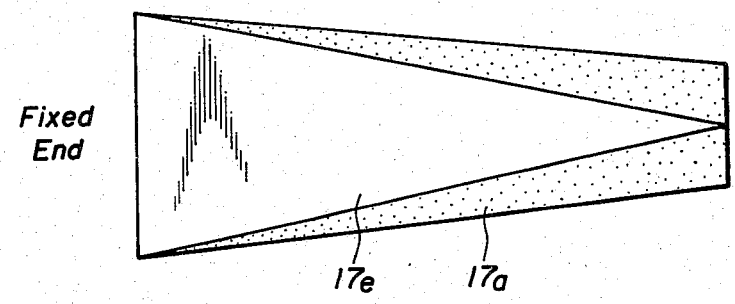
FIG. 11, FIG. 12, FIG. 13 and FIG. 14 are each plan view of the electrodes for use in another embodiment of a piezo-electric bimorph type transducer according to the present invention.

When the mass of the bimorph element can be ignored and only the mass of the magnetic head is taken into consideration, by substituting $\Delta m=0$ into Equation (14), the following identical equation is obtained:

$$We(x) \equiv S_1 m_h(x_0-x) \qquad (18)$$

where We(x) is a linear function of x and when $x=x_0$, We(x)=0. In this case, the electrode 17e is triangular in shape with its vertex corresponding to the tip of the bimorph element as shown in FIG. 11. In this case, since the shape of the function Ws(x) cannot be determined, the bimorph element can be arbitrarily shaped.

In this embodiment with a triangular electrode, since the adverse effects of the friction between the magnetic head and the magnetic tape on the operation can be eliminated, the magnetic head can always be shifted correctly in accordance with the control signal. Therefore, it can constitute a transducer extremely useful for correcting the tracking in the H-VTR.

More specifically, the bending moment produced by the friction between the magnetic head and the magnetic tape, which acts upon the bimorph element, is minimum at the movable end thereof and maximum at the fixed end thereof and proportional to the distance from the fixed end in between the fixed end and the movable end. Moreover, due to the triangular shape of the electrode, the bending moment of the electrode, produced by the control signal, is proportional to the width of the electrode and minimum at the fixed end and maximum at the movable end. Accordingly, these bending moments are countervailed.

Therefore, in this embodiment, the adverse effects of the friction between the magnetic head and the magnetic tape on the operation are cancelled, whereby correct shifting of the magnetic head can always be attained.

A further embodiment in which the mass of the magnetic head can be ignored and the mass of the bimorph element has to be taken into consideration will now be explained.

In this embodiment, by substituting $m_h=0$ into Equation (14), the following equation is obtained:

$$We(x) = S_1 d\Delta m \int_{\xi=x}^{x_0} Ws(\xi)\psi(\xi)(\xi - x)d\xi \qquad (19)$$

In this case, therefore, Equation (15) and Equation (19) are the basic equations of motion of the bimorph element. When the function Ws(x) concerning the width of the bimorph element is provided, the function We(x) concerning the width of the electrode which satisfies the condition of static and dynamic conformity can be obtained from the above-mentioned equations.

It is considered that the bimorph elements for practical use are rectangular or trapezoid in shape. Therefore, a rectangular bimorph element and a trapezoid bimorph element with their respective widths not greatly change the direction of their length are supposed, and the approximate calculation for determining the conditions of static and dynamic conformity thereof will now be performed.

In Equation (19), it is supposed that the function Ws(x) concerning the width of the bimorph element does not change much in the integration range from x to $x_0$. In this case, Ws(x) can be substituted for Ws($\xi$) for approximation. When the bimorph element is rectangular, that substitution is not for approximation, but strictly correct. Further, in the case of a trapezoidal bimorph element whose width changes in the range from 10% to 20% between the fixed end and the movable end, the results of calculation showed that the above-mentioned approximation holds fairly well.

From the above-mentioned approximation, Equation (15) and Equation (19) can be put in order and the basic equation of motion can be obtained in the form of the ratio of We(x) to Ws(x) as follows:

$$\frac{We(x)}{Ws(x)} = S_1 d\Delta m \int_{\xi=x}^{x_0} \psi(\xi)(\xi - x)d\xi \qquad (20)$$

$$\frac{We(x)}{Ws(x)} = S_2 \frac{d^2\psi(x)}{dx^2} \qquad (21)$$

This indicates that when the shape of the bimorph element does not deviate from the rectangular shape, that is, when the value of the function Ws(x) does not change much in the range between 0 and $X_0$, the static and dynamic conformity condition can be maintained so long as the ratio of We(s) to Ws(x), which is provided by Equations (2) and (21), is maintained.

With the following substitution of $$We(0) = a \cdot Wb \qquad (22)$$

where $Wb = Ws(0)$, which is the width of the bimorph element at the fixed end thereof, the ratio of $We(x)/Ws(x)$ can be obtained in the form of a series from Equation (2) and Equation (21) as follows:

$$\frac{We(x)}{Ws(x)} = a\left\{ 1 - 1.38\left(\frac{x}{x_0}\right) + 0.516\left(\frac{x}{x_0}\right)^4 \right. \qquad (23)$$

$$- 0.142\left(\frac{x}{x_0}\right)^5 + 0.0038\left(\frac{x}{x_0}\right)^8$$

$$\left. - 0.0006\left(\frac{x}{x_0}\right)^9 + \cdots \right\}$$

Thus, the ratio $We(x)/Ws(x)$ is provided in the form of an infinite series. That ratio can be approximated by use of the finite terms of the infinite series. When the width of the bimorph element and that of the electrode are the same at the fixed end of the bimorph element, $a = 1$ in Equation (22) and Equation (23).

The results of our numerical calculations concerning a further embodiment of the present invention, employing a short rectangular bimorph element, showed that the shape of the electrode 17e is in the shape as shown in FIG. 11. With respect to a still further embodiment of the present invention, employing a trapezoidal bimorph element, the same sort of calcuation indicated that the shape of the electrode 17e is that shown in FIG. 13.

The meaning of Equation (14) in physical terms will now be explained.

The left side of the equation indicates the width of the electrode and the bending force caused by the piezo-electric effect at the point x. The right side of the equation indicates a value proportional to the moment of inertia acting upon the point x in accordance with the mass of the magnetic head and the mass of the bimorph element. Therefore, Equation (14) signifies that the bending force caused by the piezo-electric effect and applied to each portion of the bimorph element is in proportion to the moment of inertia applied to each portion of the bimorph element.

In other words, when the bimorph element is in motion, the inertia produced by the mass of the magnetic head and the mass of the bimorph element becomes a load on the bending force caused by the piezo-electric effect. Equation (14) indicates that that load is uniform at any portion of the bimorph element. When the bimorph element is rectangular or trapezoidal in shape, the bending moment produced by the inertia increases towards the fixed end of the bimorph element. In order to overcome such increase of the bending moment, it is required that the bending force produced by the piezo-electric effect be increased by increasing the width of the electrode towards the fixed end of the bimorph element. For this reason, in the embodiments shown in FIG. 11, FIG. 12 and FIG. 13, the width of each electrode is increased towards the fixed end of the bimorph element.

By increasing the bending force produced by the piezo-electric effect in the portion where the effect of inertia is great, the load applied to the bimorph element is made uniform throughout the entire bimorph element, whereby the effect of the inertia is distributed uniformly to the entire bimorph element, avoiding application of a great load to a particular portion of the bimorph element.

By this mechanism, the bimorph element is bent in the same shape regardless of its dynamic bending and static bending, which, as previously described, is referred to as static and dynamic conformity.

In contrast, when the electrode is disposed throughout the entire bimorph element which is rectangular in shape as in the conventional bimorph element, that is, in the case where $We(x) = Ws(x)$, although the bending moment produced by the inertia increases towards the fixed end of the bimorph element, the width of the electrode is the same at any portion thereof. Therefore, the load of the bending moment produced by the inertia increases towards the fixed end of the bimorph element. In this case, the movable end portion of the bimorph element is bent more through dynamic bending than through static bending. Such effect of the inertia increases as the frequency of the vibrations of the bimorph element increases. Therefore, in the rectangular bimorph element with an electrode disposed throughout the entire bimorph element, which does not satisfy the condition of static and dynamic conformity, as the frequency of the vibrations of the bimorph element increases the dynamic bending mode of the bimorph element deviates more from the static bending mode thereof.

On the other hand, in such bimorph elements satisfying the condition of static and dynamic conformity, the function indicating the bending of the bimorph element is not affected by the changes in frequency of the vibrations of the bimorph element.

The function, $\psi(x)$, which indicates the bending mode of the bimorph element under the condition of static and dynamic conformity, can be obtained easily from Equation (21) as follows:

$$\psi(x) = 1.761\left(\frac{x}{x_0}\right)^2 - 0.810\left(\frac{x}{x_0}\right)^3 + 0.061\left(\frac{x}{x_0}\right)^6 \qquad (24)$$

$$- 0.012\left(\frac{x}{x_0}\right)^7 + \cdots$$

Figure 12:
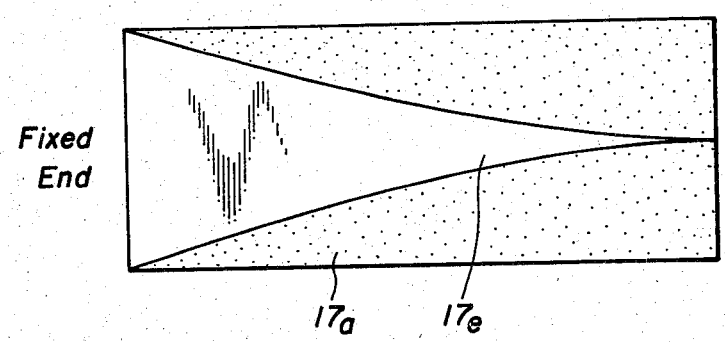
Figure 13:
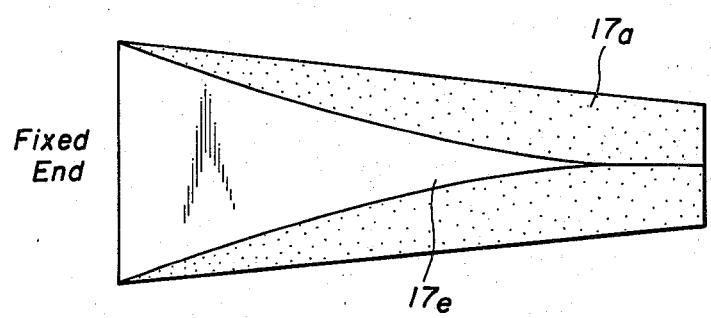

This function $\psi(x)$ can be applied to both the static bending and the dynamic bending. In the bimorph elements which satisfy static and dynamic conformity, the width of the electrodes increases towards the fixed ends thereof as shown in FIG. 11, FIG. 12 and FIG. 13. Therefore, the bending angle of the bimorph element is most near the fixed end thereof and decreases towards the movable end thereof.

Therefore, the inclination of the bimorph element at the movalbe end, $$\left| \frac{d\psi(x)}{dx} \right|_{x=x_0}$$

is smaller than that of the rectangular entire electrode type bimorph element. This signifies that the angle between the contact surface of the magnetic head and the surface of the magnetic tape is rather small. In this sense, the bimorph element with static and dynamic conformity is advantageous.

As mentioned previously, it is not necessarily required that the condition of static and dynamic conformity be observed strictly. The nearer to the ideal condition of static and dynamic conformity the bimorph element is constructed, the nearer to the ideal operation will be the operation of the bimorph element.

To what extent that static and dynamic conformity condition is approximated for practical use is a matter of choice when designing each bimorph element. Therefore, the shape of the electrode can be determined with a rather rough approximation of the static and dynamic conformity, taking into consideration various conditions when manufacturing the bimorph elements. For example, in Equation (23), when only the first two terms are employed and the remaining terms of higher order are omitted, $We(x)/Ws(x)$ is a linear function of x. When the bimorph element is rectangular or trapezoidal in shape and the function $We(x)$ is a linear function of x, the shape of the electrode is triangular, as the electrode in FIG. 9.

Figure 14:
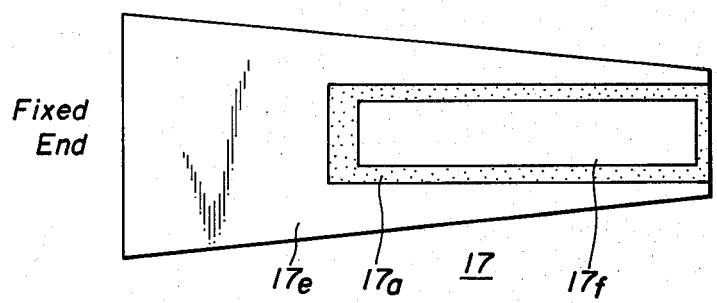

When the bimorph element 17 is trapezoidal in shape as shown in FIG. 14 and the width of the electrode 17e gradually decreases from the central portion of the bimorph element 17 towards the movable end thereof, and an electrode 17f for detecting, for example, the bending of the bimorph element 17 is attached to a portion of the bimorph element where the electrode 17e is not mounted, the condition of static and dynamic conformity can be satisfied to a significant extent. The present invention covers the above-mentioned construction as an embodiment thereof.

In conclusion, the advantages of transducers which can attain the above-mentioned static and dynamic conformity according to the present invention can be summarized as follows:

1. Since the voltage applied to the electrode is in proportion to the magnitude of vibrations of the bimorph element, the control of the bimorph element for tracking and the damping of the transient movement of the bimorph element can be done easily.

2. Since no abnormal vibrations take place in the bimorph element, there is no risk of the bimorph element being damaged.

3. When tracking control is performed, the operational surface of the magnetic head attached to the movable end of the bimorph element is maintained fairly well in parallel to the surface of the magnetic tape, and variations in the amplitude of the reproduction signals are significantly reduced.

4. Since the bimorph element is significantly less affected by the resonance thereof, the decrease of the vibration magnitude of the bimorph element caused by the anti-resonance thereof can be reduced.

What is claimed is:

1. A piezo-electric bimorph type transducer of a cantilever type for shifting a magnetic head for a magnetic recording and reproduction apparatus, which transducer comprises a piezo-electric bimorph element including:

a pair of piezo-electric thin plates, with the width thereof, Ws, changing gradually in the direction from a fixed end of a cantilever towards a movable end thereof, in accordance with a predetermined function f(x), where x is the distance from said fixed end toward said movable end; and a plurality of electrodes, with the width thereof, We, gradually decreasing in the direction from said fixed end toward said movable end, in accordance with a function G(x), where x is the distance from said fixed end toward said movable end, and said function G(x) is determined in such a manner that said width We of said electrodes is smaller than said width Ws of said piezo-electric thin plates in the direction from said fixed end towards said movable end, whereby, in a comparatively broad frequency range of a control signal applied to said electrodes, the displacement of each portion of said bimorph element in the range from said fixed end toward said movable end is obtained so as to be proportional to the magnitude of said control signal with a constant of proportion, which constant of proportion is the product of a first value determined only by the position of each portion of said bimorph element and a second value determined only by the frequency of said control signal, and with the phase difference which is determined only by the frequency of said control signal.

2. A piezo-electric bimorph type transducer as claimed in claim 1, wherein the constant of said function G(x) is determined in such a manner that the shape of said electrodes of said bimorph element is an approximate triangle with a base thereof at said fixed end and with a vertex thereof at an operational gap top portion of a magnetic head disposed at said movable end, whereby the effect of the friction between said magnetic head and a magnetic tape on the displacement of said bimorph element is minimized.

3. A piezo-electric bimorph type transducer as claimed in claim 1, wherein said piezo-electric thin plates which constitute said bimorph element are rectangular in shape, extending from said fixed end to said movable end of said cantilever.

4. A piezo-electric bimorph type transducer as claimed in claim 1, wherein said piezo-electric thin plates which constitute said bimorph element are trapezoid in shape with a lower base thereof at said fixed end and an upper base thereof at said movable end.

5. A piezo-electric bimorph type transducer as claimed in claim 1, wherein an electrode member is disposed on part of the surface of said piezo-electric thin plates which constitute said bimorph element, which electrode member is independent of said electrodes and from which electrode member a signal indicating the displacement of said bimorph element can be obtained.

* * * * *